(12) United States Patent
Ueno

(10) Patent No.: US 8,039,346 B2
(45) Date of Patent: Oct. 18, 2011

(54) INSULATED GATE SILICON CARBIDE SEMICONDUCTOR DEVICE AND METHOD FOR MANUFACTURING THE SAME

(75) Inventor: Katsunori Ueno, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 12/842,116

(22) Filed: Jul. 23, 2010

(65) Prior Publication Data

US 2010/0285647 A1    Nov. 11, 2010

Related U.S. Application Data

(62) Division of application No. 12/021,773, filed on Jan. 29, 2008, now Pat. No. 7,791,135.

(30) Foreign Application Priority Data

Jan. 29, 2007    (JP) ................................. 2007-017945

(51) Int. Cl.
*H01L 21/8236* (2006.01)

(52) U.S. Cl. . 438/268; 257/229; 257/330; 257/E21.643; 257/E29.318

(58) Field of Classification Search .................. 438/199, 438/289; 257/E21.336, 331, 332, 334
See application file for complete search history.

(56) References Cited

U.S. PATENT DOCUMENTS

| | | | |
|---|---|---|---|
| 5,895,939 A | 4/1999 | Ueno | |
| 6,091,108 A | 7/2000 | Harris et al. | |
| 6,750,508 B2 | 6/2004 | Omura et al. | |
| 6,800,509 B1 | 10/2004 | Lin et al. | |
| 7,154,130 B2 | 12/2006 | Kumar et al. | |
| 2003/0073270 A1* | 4/2003 | Hisada et al. | 438/197 |

(Continued)

FOREIGN PATENT DOCUMENTS

EP    1814162 A1    8/2007

(Continued)

OTHER PUBLICATIONS

Kenji Fukuda et al.; "Ultra Low Loss SiC MOSFET and JFET"; Lecture Material; Nov. 10-11, 2005; pp. 147-148; National Institute of Advanced Industrial Science and Technology Power Electronics Research Center; Tsukuba-shi, Japan.

*Primary Examiner* — Matthew Landau
*Assistant Examiner* — Sonya McCall Shepard
(74) *Attorney, Agent, or Firm* — Rossi, Kimms & McDowell LLP

(57) ABSTRACT

An insulated gate silicon carbide semiconductor device is provided having small on-resistance in a structure obtained by combining the SIT and MOSFET structures having normally-off operation. The device includes an n⁻ semiconductor layer on an SiC n⁺ substrate, a p-type base region and highly doped p-region both buried in the layer, a trench from the semiconductor layer surface to the p-base region, an n⁺ first source region in the surface of a p-type base region at the bottom of the trench, a p-type channel region in the surface of the sidewall of the trench, one end of which contacts the first source region, a gate electrode contacting the trench-side surface of the channel region via a gate insulating film, and a source electrode contacting the trench-side surface of the gate electrode via an interlayer insulating film and contacting the exposed first source region and p-base region at the bottom of the trench.

6 Claims, 13 Drawing Sheets

U.S. PATENT DOCUMENTS

| | | |
|---|---|---|
| 2003/0164527 A1* | 9/2003 | Sugi et al. .................. 257/401 |
| 2003/0178672 A1 | 9/2003 | Hatakeyama et al. |
| 2005/0029557 A1 | 2/2005 | Hatakeyama et al. |
| 2005/0029558 A1 | 2/2005 | Hatakeyama et al. |
| 2005/0142713 A1 | 6/2005 | Fujishima et al. |
| 2006/0057796 A1 | 3/2006 | Harada et al. |
| 2006/0226504 A1 | 10/2006 | Hatakeyama et al. |
| 2007/0238253 A1* | 10/2007 | Tucker ........................ 438/289 |
| 2008/0173876 A1 | 7/2008 | Ueno |

FOREIGN PATENT DOCUMENTS

| | | |
|---|---|---|
| JP | 2001-94097 A | 4/2001 |
| JP | 2004-006723 A | 1/2004 |
| JP | 2004-247496 A | 9/2004 |
| JP | 2006-147789 A | 6/2006 |
| WO | 2004036655 A1 | 4/2004 |

* cited by examiner

INSULATED GATE SILICON CARBIDE SEMICONDUCTOR DEVICE AND METHOD FOR MANUFACTURING THE SAME

This is a divisional of and claims priority from U.S. patent application Ser. No. 12/021,773 filed Jan. 29, 2008, the content of which is incorporated herein by reference.

BACKGROUND

The present invention relates to a vertical power semiconductor device (hereinafter referred to as "power device") primarily made of a silicon carbide (SiC) semiconductor material and capable of voltage driving through an insulated gate.

Devices that handle a large amount of electric power, so-called power devices, have been conventionally manufactured by primarily using silicon semiconductors. Since a power device can have a large electric current capacity, it often has a structure in which electric current flows in the thickness direction (vertical direction) between the two principal planes of the chip. Among such conventional power devices is a vertical insulated gate field effect transistor. FIG. 9 is a cross-sectional view of a conventional representative vertical insulated gate field effect transistor (MOSFET).

The cross-sectional view shown in FIG. 8 is the basic structure of a well known device called a static induction transistor (hereinafter abbreviated as "SIT"). The SIT structure includes gates obtained by selectively burying p$^+$ regions 54 in an n-type high-resistance (low-concentration) drift layer 53 deposited on an n$^+$ semiconductor substrate 51. When a negative bias is applied to the gate with respect to a drain 56 provided on the underside of the semiconductor substrate 51, a depletion layer expands in a pinch-off region 52 provided between each pair of the p$^+$ regions 54, which are the gates, and blocks the electric current path from the drain 56 through the pinch-off region 52 and an n$^+$ source region 57 to a source 58. Such SIT devices are characterized by a monopolar structure in which electric current basically only flows through n-type regions, so that small on-resistance close to an ideal value is likely provided. Prototype devices have been reported having the SIT structure using SiC semiconductors with excellent characteristics as well as those using silicon semiconductors. However, the basic structure of the SIT device is in the conducting state when no bias is applied to the gate (normally-on). Therefore, when the gate drive circuit malfunctions due to noise or the like and hence no gate voltage is applied, the device remains conducting, possibly resulting in a serious failure, such as breakdown of the circuit in the worst case. Use of the SIT device requires caution in the gate bias conditions, which poses difficulty in using the SIT device.

The vertical MOSFET, an insulated gate-driven device, is frequently used as the power device described above. FIG. 9 shows a typical planar gate MOSFET in which gate insulating films 124 and gate electrodes 111, each having a flat shape, are formed on the principal plane of a semiconductor substrate (100+103). In FIG. 9, n$^+$ surface regions 121 provided immediately under the gate insulating films 124 located on both sides of a p-well 113 in the substrate surface are not formed in many cases. When reduction in size of the unit pattern for lowering on-resistance of the power device narrows the region immediately under the gate insulating film 124 sandwiched between the p-wells 113 in adjacent unit patterns, the pinch-off resistance increases because a depletion layer expands when a bias is applied to a drain electrode 106. To prevent the pinch-off resistance and hence the on-resistance from increasing, the high-concentration n$^+$ surface regions 121 are provided. The concentration (impurity concentration) is approximately $1 \times 10^{18}$ cm$^{-3}$ at the most, because higher concentrations prevent the depletion layer from expanding along the surface, resulting in reduction in blocking voltage. Reference numeral 111 denotes the gate electrode. Reference numeral 104 denotes an interlayer insulating film. Reference numeral 105 denotes an emitter electrode. Reference numeral 114 denotes an emitter region. Reference numeral 115 denotes a contact high-concentration p$^+$ region.

In the vertical MOSFET, unlike the SIT shown in FIG. 8, the on-resistance of the element includes not only the resistance of the n-type semiconductor region (the high-resistance drift layer 103, in particular) but also the resistance in channel regions that are located immediately under the gate electrodes 111 and the gate insulating films 124, and formed in the surfaces of the p-well 113 sandwiched between the emitter regions 114 and the high-concentration n$^+$ surface regions 121. The total resistance of the channel regions in the whole element decreases when the size of the unit pattern is reduced to increase the channel density, since the channel regions are arranged in parallel. Accordingly, to lower the on-resistance of the whole element, the unit pattern is preferably configured in such a way that the channel density is maximized.

The cross-sectional view of FIG. 10 shows a conventional trench gate MOSFET devised in such a way that more reduction in channel resistance through the size reduction described above is achieved than in the planar gate MOSFET. In the trench gate structure indicated by a gate electrode 223, a gate insulating film 224, and a trench 235, the trench 235 extends downward perpendicularly to the principal plane, so that the trench density along the surface can be easily increased. The trench gate structure (223, 224, and 235) therefore easily achieves a higher channel density than that in the planar gate structure shown in FIG. 9. Furthermore, in the trench gate structure, the fact that the pinch-off resistance in the region sandwiched between p-wells 225 structurally decreases makes the trench gate MOSFET more advantageous than the planar gate MOSFET from the viewpoint of the pinch-off resistance. Reference numeral 220 denotes an n$^+$ semiconductor substrate. Reference numeral 222 denotes a high-resistance drift layer. Reference numeral 228 denotes an n$^+$ emitter region. Reference numeral 226 denotes a p$^+$ contact region. Reference numeral 230 denotes an interlayer insulating film. Reference numeral 227 denotes an emitter electrode.

However, in a silicon power device, since the channel density has already been almost maximized by making full use of the process technology of the trench gate structure and the LSI microprocessing technology, the semiconductor characteristics of the silicon power device have approached the limit determined by the material. To break through this material limit, there have been attempts to change the semiconductor material from silicon to any of those having broader band gaps, such as SiC and GaN. Since the maximum breakdown fields of these materials are larger by approximately one order of magnitude than that of silicon, it is expected that use of any of these materials for a power device lowers the resistance of the element to one hundredth or smaller. Prototypes of SiC-MOSFET devices and SiC-SIT devices having structures similar to those of silicon devices have been built and have shown excellent characteristics.

JP-A-2006-147789 and corresponding European Patent Publication EP 1,814,162 A1 describe a SiC-MOSFET in which the on-resistance is lowered by forming a structure including an n$^+$ SiC substrate, an n-type high-resistance (low-concentration) drift layer stacked thereon, a high-concentration p-gate layer buried therein, and a MOS channel region further formed thereon, the MOS channel region being a low-concentration p-type deposition layer. It is necessary to selectively convert the p-type deposition layer into an n-type base region through ion implantation to form an electric current path. However, the n-type base region cannot be thick due to the practical limit of depth to which ions can be implanted (equal to the thickness of the p-type deposition layer), so that a high electric field is applied to the gate insulating film and hence the off-state voltage is not improved. To solve this problem, the above-referenced documents reported interposing a low-concentration n-type deposition layer between the low-concentration p-type deposition film and the high-concentration gate layer of a SiC MOSFET. The base region converted into the n-type through ion implantation is selectively formed in the low-concentration p-type deposition film so as to increase the thickness of the n-type deposition film between the high-concentration gate layer and the low-concentration p-type deposition film (channel region).

JP-A-2001-94097 discloses a MOSFET device as shown in the cross-sectional view of the semiconductor substrate of the MOSFET in FIG. 11. This device includes an $n^+$ channel layer 305a deposited on the exposed surface of an $n^-$ epitaxial layer 302a stacked on an SiC-$n^+$ substrate 1 and on part of the surfaces of $p^-$ base regions 303a and 303b, $n^+$ source regions 304a and 304b formed in the surface portions of the $p^-$ base regions 303a and 303b, ion implanted p-type channel layers 305b, one of the channel layers sandwiched between the $n^+$ source region 304a and the n-type channel layer 305a and the other sandwiched between the $n^+$ source region 304b and the n-type channel layer 305a, and a gate electrode 308 formed above the channel layers 305b and the n-type channel layer 305a via a gate insulating film 307. This SiC semiconductor device not only has the MOSFET channel structure having the normally-off capability but also a capability to lower the on-resistance even when the depletion layer expands between the $p^-$ base regions 303a and 303b at the time of ON by increasing the concentration in the n-type channel layer 305a.

As described above, a MOSFET made of a silicon carbide semiconductor is expected to have an excellent blocking voltage characteristic because the dielectric breakdown field of a silicon carbide semiconductor is higher than that of a silicon semiconductor by one order of magnitude. However, a $SiO_2$ film is primarily used as the gate insulating film as in silicon semiconductor, that is, a large blocking voltage cannot be provided in many cases. Corners are formed on the gate insulating film and the electric field concentrates at the corners of the gate insulating film, so that an excessive electric field is applied, particularly in a trench MOSFET. An electric field normally applied in SiC therefore cannot be applied, so that only a much lower blocking voltage is provided. Accordingly, to avoid the problem of reduced blocking voltage due to dielectric breakdown of the gate insulating film in silicon carbide semiconductor, a planar gate MOSFET has been fabricated as a prototype in many cases.

Since a SiC semiconductor has lower channel mobility in a MOSFET than a silicon semiconductor, a high-density channel structure is more desirable to lower the channel resistance than in silicon semiconductor. However, a sufficiently high-density channel structure is not always provided since a SiC semiconductor needs to employ a planar gate MOSFET as described above, which suffers from a low level of channel size reduction. Since a SIT uses no gate insulating film, it does not have the problem of insulating film breakdown described above. However, a SIT is a so-called normally-on device, that is, it has source-drain continuity in the no-bias state in which no voltage is applied to the gate. This becomes a problem when a SIT is actually applied to a circuit, and hence a SIT is regarded as a hard-to-use device. In a practical circuit, when a problem occurs in a gate circuit and no voltage can be applied to the gate, a so-called normally-off device is preferable from the viewpoint of safety because a normally-off power device having such a defective gate automatically blocks electric current.

As a method to eliminate the normally-on device phenomenon from a power device having the SIT structure, there has been proposed a complex device structure shown in an equivalent circuit in FIG. 2. This device has a structure in which a SIT 16 and a MOSFET 15, which is a low blocking voltage normally-off device, are serially cascaded. When an off-state signal is applied to the gate 18 of the MOSFET 15, the MOSFET 15 becomes blocked, so that the potential at the source region of the SIT 16 increases. A negative bias is therefore applied to the gate of the SIT 16, so that the SIT 16 is also turned off. The device having such a configuration is a normally-off device without the normally-on device phenomenon. This configuration, however, results in a large on-resistance device in which the MOSFET 15 is added to the SIT 16, which means that the advantage of a SiC semiconductor device, namely small on-resistance with a small area, is lost.

In view of the points described above, it would be preferable to provide an insulated gate silicon carbide semiconductor device and a method for manufacturing the same, wherein the semiconductor device has small on-resistance, the advantage of the static induction transistor structure is fully used, and the advantage of the field effect transistor structure characterized by the normally-off operation is obtained, in a structure obtained by combining the static induction transistor structure with the insulated gate field effect transistor structure.

SUMMARY OF THE INVENTION

In a first aspect of the invention, an insulated gate silicon carbide semiconductor device primarily made of a silicon carbide semiconductor material is provided. The semiconductor device includes a first conduction-type low-concentration deposition semiconductor layer deposited on a first conduction-type high-concentration semiconductor substrate, a second conduction-type base region buried in the first conduction-type low-concentration deposition semiconductor layer, a trench extending from the surface of the first conduction-type low-concentration deposition semiconductor layer to the second conduction-type base region, a first conduction-type first source region selectively formed in the surface layer of the second conduction-type base region at the bottom of the trench, and a second conduction-type channel region formed in the surface layer of the first conduction-type low-concentration deposition semiconductor layer along the sidewall of the trench. One end of the second conduction-type channel region is in contact with the first conduction-type first source region, a gate electrode is in contact with the surface of the sidewall of the trench in the second conduction-type channel region via a gate insulating film, and a source electrode is in contact with the surface of the gate electrode on the trench side via an interlayer insulating film, and is in contact with the surface of the first conduction-type first source region and the surface of the second conduction-type base region, with the surfaces exposed at the bottom of the trench.

In a second aspect of the invention, in the device according to the first aspect, the gate electrode in contact with the surface of the sidewall of the trench in the other conduction-type channel region via the gate insulating film does not extend into the upper portion of the first conduction-type low-concentration deposition semiconductor layer between the trenches.

In a third aspect of the invention, the device according to the first aspect further comprises a first conduction-type high-concentration second source region in the surface layer of the first conduction-type low-concentration deposition semiconductor layer between the trenches.

In a fourth aspect of the invention, in the device according to the third aspect, the second conduction-type base region has a two-layer configuration including a deep high-concentration first base region and a shallow low-concentration second base region.

In a fifth aspect of the invention, the device according to the fourth aspect further comprises a contact trench at the bottom of the trench, the contact trench reaching the first base region, and the source electrode is placed in contact with the contact trench.

In a sixth aspect of the invention, a method is provided for manufacturing the insulated gate silicon carbide semiconductor device of the third aspect. The method comprises forming the second conduction-type base region buried in the low-concentration deposition semiconductor layer and the trench extending from the surface of the low-concentration deposition semiconductor layer to the second conduction-type base region, forming the second conduction-type channel region along the sidewall of the trench through oblique ion implantation, and simultaneously forming the first conduction-type first source region and the first conduction-type second source region.

According to the invention, an insulated gate silicon carbide semiconductor device, and a method for manufacturing the same, are provided, wherein the semiconductor device has small on-resistance, the advantage of the static induction transistor structure is fully used, the advantage of the field effect transistor structure characterized by the normally-off operation is obtained, in a structure obtained by combining the static induction transistor structure with the insulated gate field effect transistor structure.

BRIEF DESCRIPTION OF THE DRAWINGS

The invention will be described with respect to certain preferred embodiments and the accompanying drawings, wherein.

DESCRIPTION OF THE PREFERRED EMBODIMENTS

Figure 1:
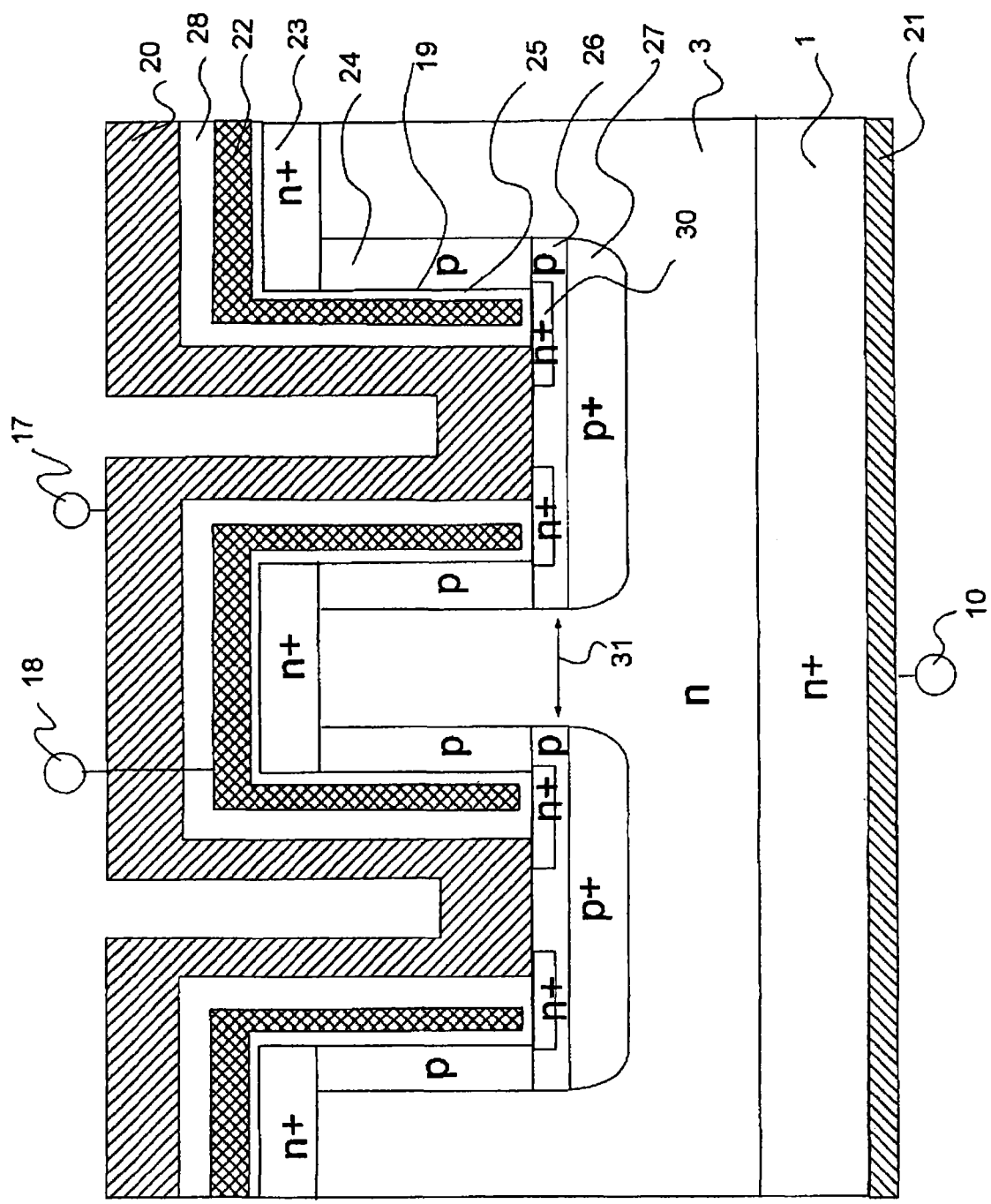
FIG. 1 is a cross-sectional view of the insulated gate silicon carbide semiconductor device according to a first embodiment of the invention.

Preferred embodiments of the insulated gate silicon carbide semiconductor device and the method for manufacturing the same according to the invention will be described below in detail with reference to the accompanying drawings. In the following description of the embodiments and the accompanying drawings, similar configurations have the same reference character and redundant description thereof will be omitted.

Figure 2:
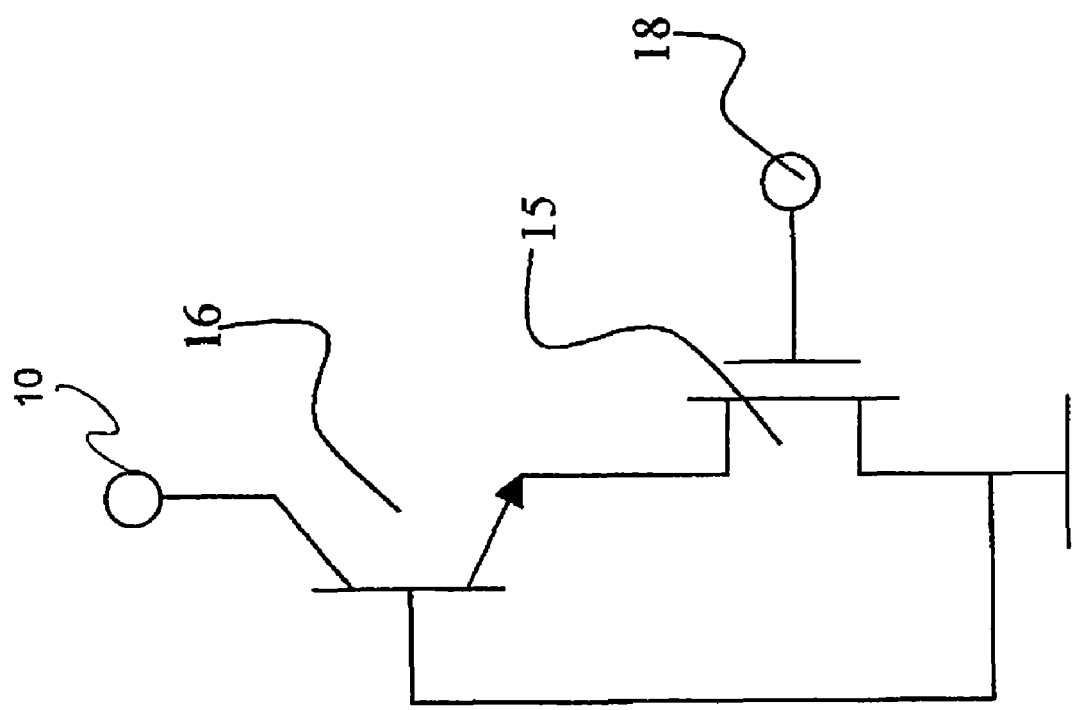
FIG. 2 is an equivalent circuit diagram of the insulated gate silicon carbide semiconductor device according to the invention.
Figure 5:
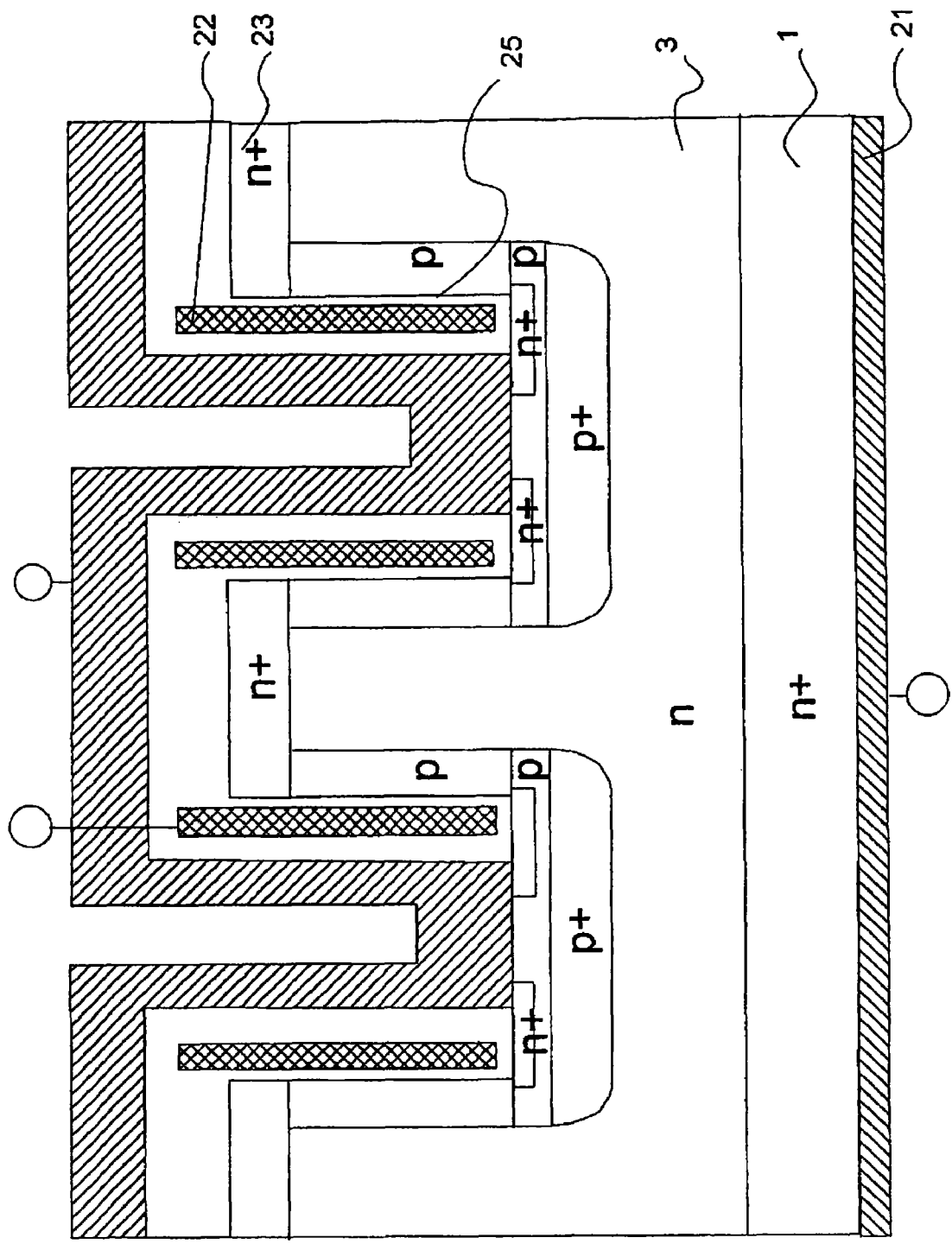
FIG. 5 is a cross-sectional view of the insulated gate silicon carbide semiconductor device according to a third embodiment of the invention.
Figure 6:
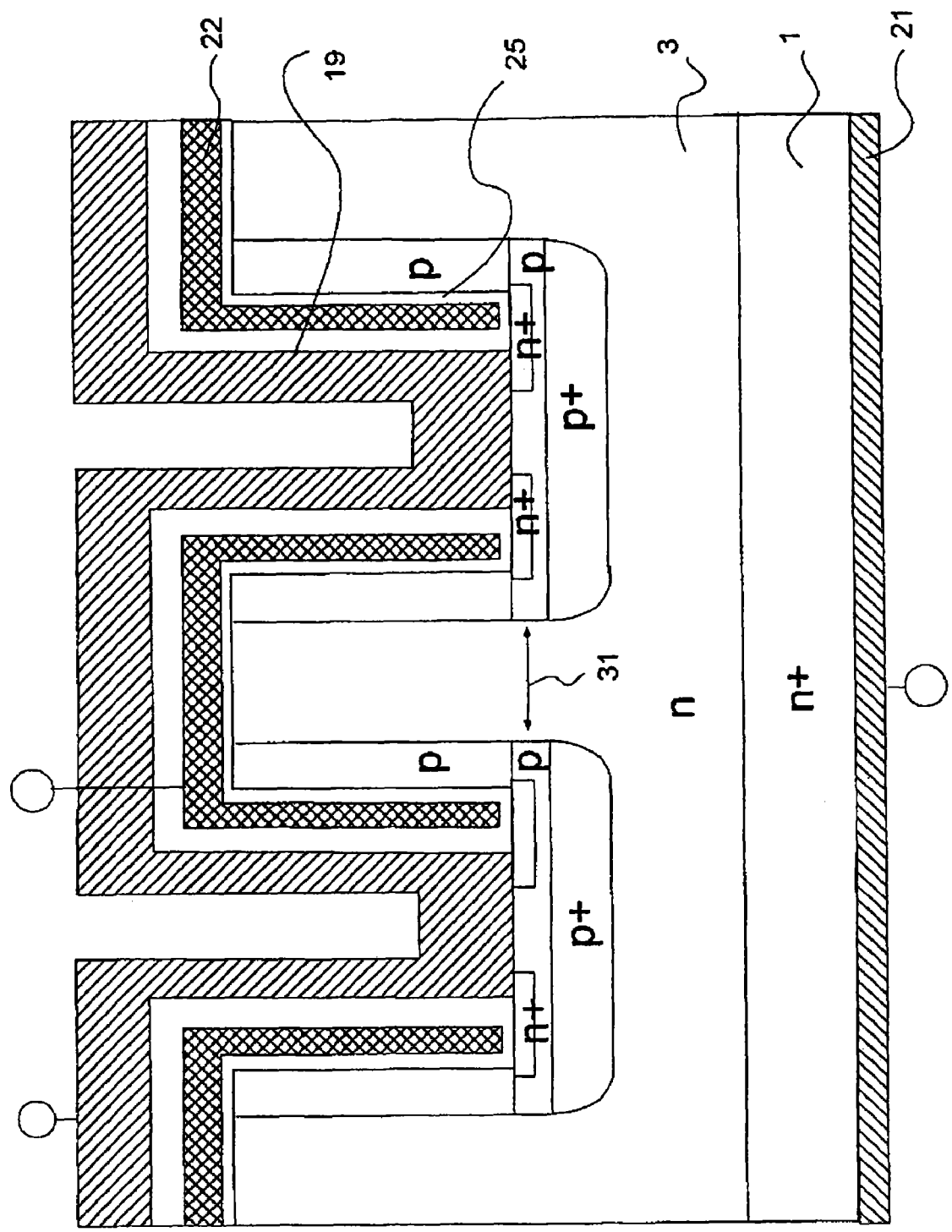
FIG. 6 is a cross-sectional view of the insulated gate silicon carbide semiconductor device according to a fourth embodiment of the invention.
Figure 7:
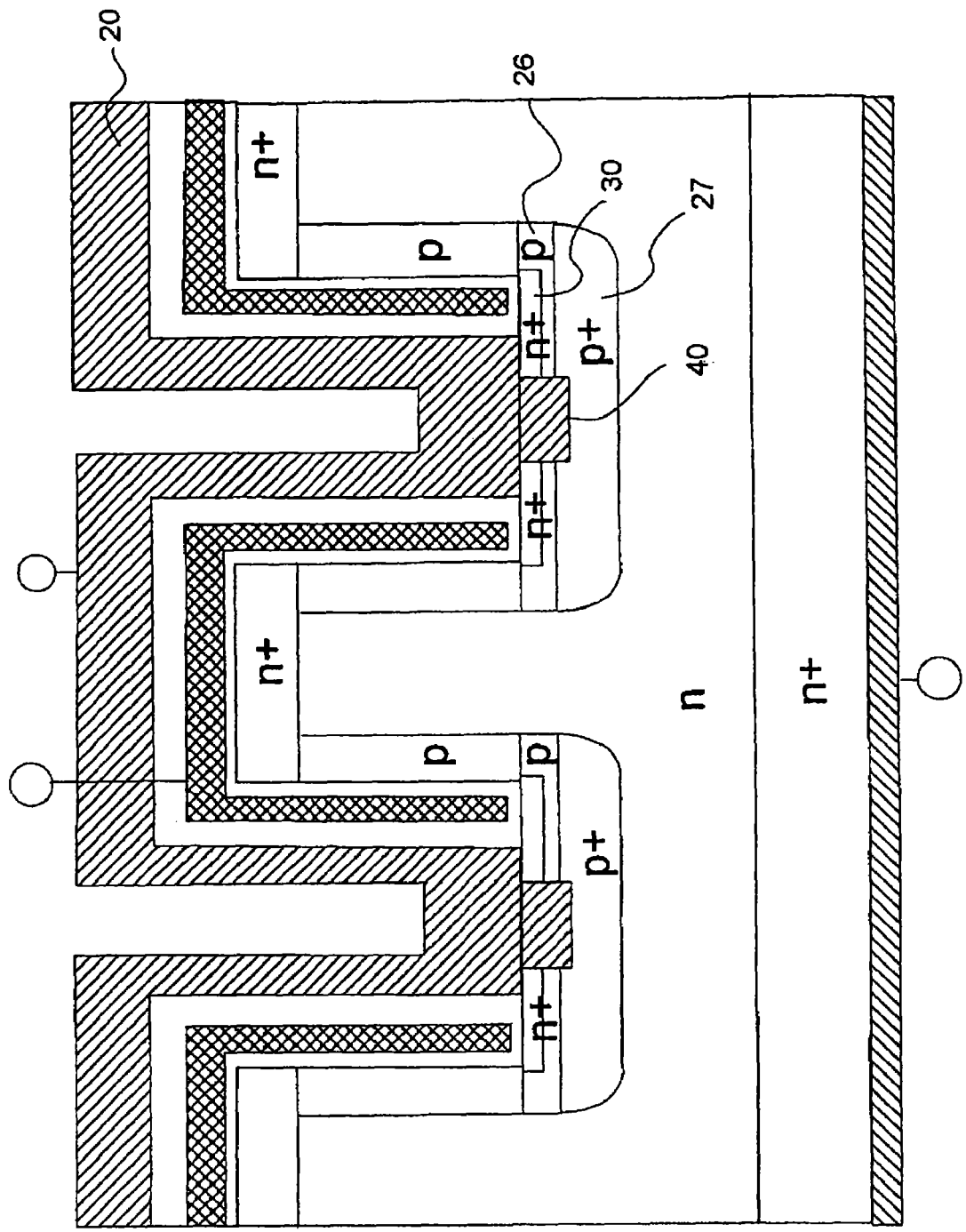
FIG. 7 is a cross-sectional view of the insulated gate silicon carbide semiconductor device according to a fifth embodiment of the invention.
Figure 8:
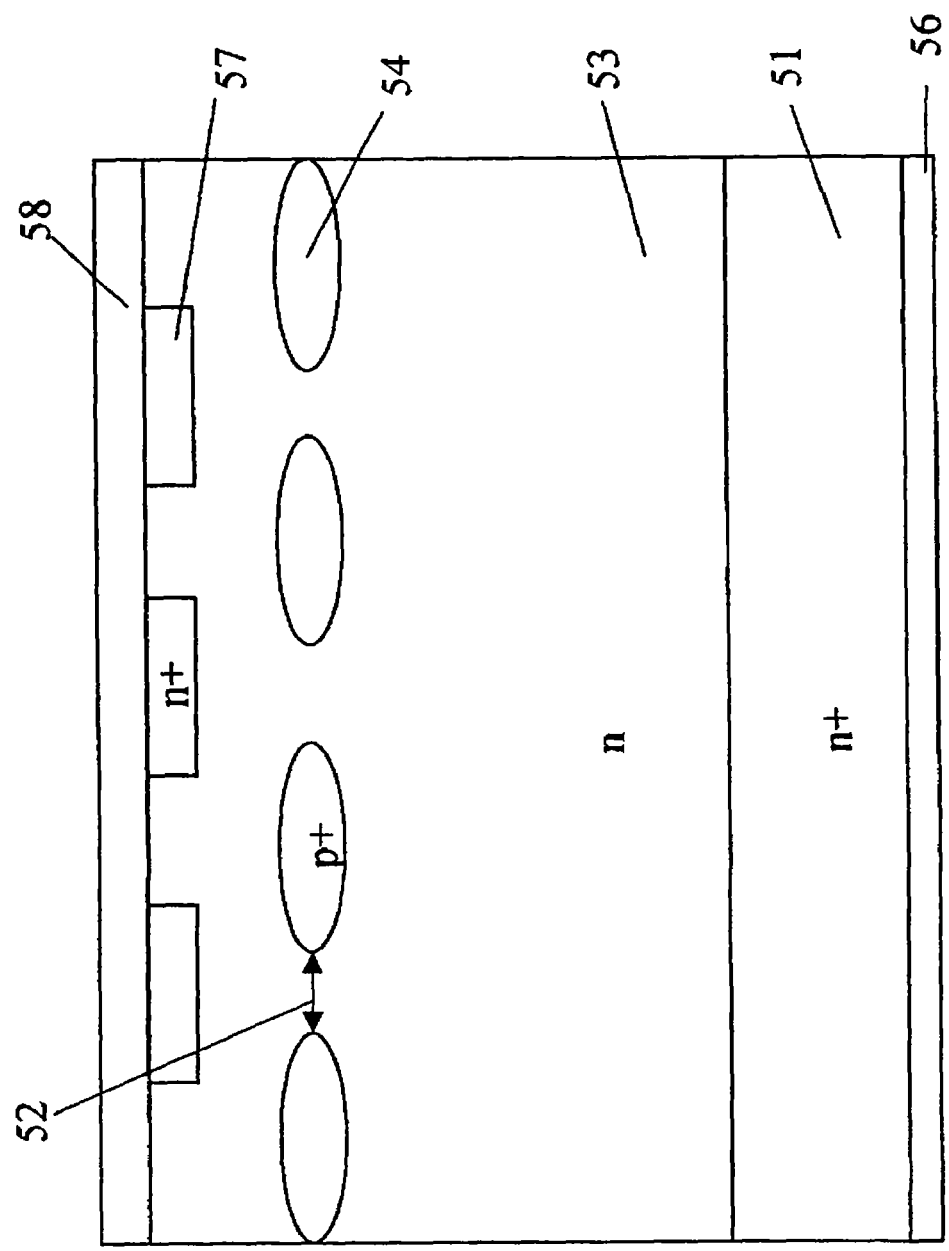
FIG. 8 is a cross-sectional view showing the structure of a conventional static induction transistor.
Figure 9:
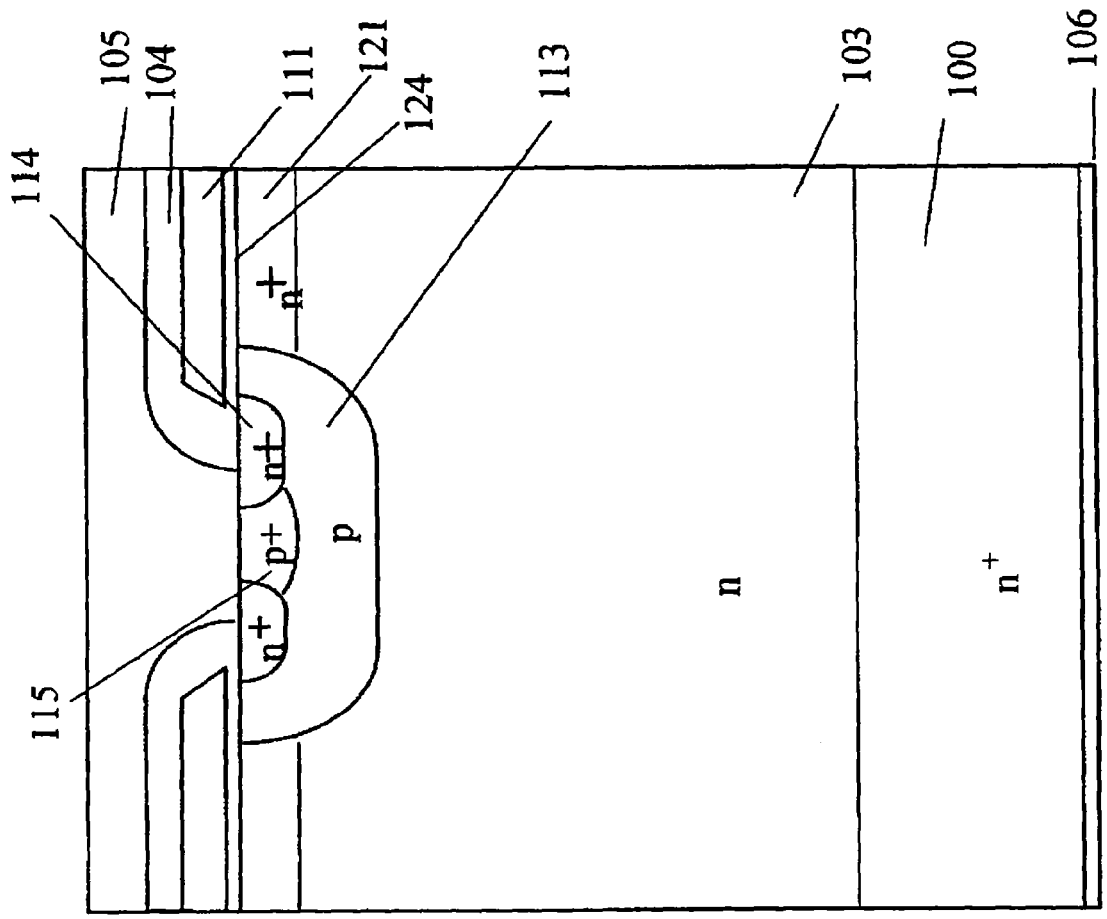
FIG. 9 is a cross-sectional view showing the structure of a conventional vertical planar gate MOSFET.

FIG. 1 is a cross-sectional view of the insulated gate silicon carbide semiconductor device according to a first embodiment. FIG. 2 is an equivalent circuit diagram of the insulated gate silicon carbide semiconductor device according to the first embodiment. FIGS. 3A to 3G are cross-sectional views showing a method for manufacturing the insulated gate silicon carbide semiconductor device according to the first embodiment. FIGS. 4A to 4G are cross-sectional views showing the method for manufacturing the insulated gate silicon carbide semiconductor device according to a second embodiment. FIG. 5 is a cross-sectional view showing the insulated gate silicon carbide semiconductor device according to a third embodiment. FIG. 6 is a cross-sectional view showing the insulated gate silicon carbide semiconductor device according to a fourth embodiment. FIG. 7 is a cross-sectional view showing the insulated gate silicon carbide semiconductor device according to a fifth embodiment.

First Embodiment

FIG. 1 is a cross-sectional view of an insulated gate silicon carbide semiconductor device showing a first embodiment according to the invention. In FIG. 1, the SIT structure includes an $n^+$ region 23 (source), a $p^+$ region 27 (gate), an n-type high-resistance (low-concentration) drift layer 3, and an $n^+$ substrate 1 (drain). The gate of the SIT corresponds to the $p^+$ region 27 (although the $p^+$ region 27 is included in the second conduction-type base region in the appended claims, the $p^+$ region 27 is hereinafter referred to as "$p^+$ gate region" because it is the gate for the SIT). In FIG. 1, the $n^+$ region 23 (hereinafter referred to as "$n^+$ second source region") corresponding to the source region of the SIT is not directly connected to an electrode, but also serves as the drain region of a MOSFET structure formed on the sidewall of a trench 19, so that the SIT structure and the MOSFET structure are cascaded. The equivalent circuit in FIG. 2 shows the cascade connection between the SIT structure and the MOSFET structure.

The MOSFET structure shown in FIG. 1 includes a gate insulating film 25 and a gate electrode 22 provided on the surface of the sidewall of the trench 19 extending from the surface to a p-base region 26. Furthermore, a p-type channel region 24 is formed along the surface layer of the sidewall of the trench 19 on the n-type high-resistance (low-concentration) drift layer 3 side in such a way that the p-type channel region 24 connects the $n^+$ second source region 23 to the p-base region 26 and an $n^+$ first source region 30. When a gate voltage greater than or equal to a threshold value is applied to the gate electrode 22 on the surface of the sidewall, a channel that is inverted into the n-type is formed in the surface of the p-type channel region 24. This channel becomes the electric current path in the MOSFET structure. The $n^+$ second source region 23, which is the source of the SIT structure (the drain of the MOSFET structure), which is formed of a drain electrode 21, the $n^+$ substrate 1, the n-type high-resistance (low-concentration) drift layer 3, and the $n^+$ second source region 23, is serially connected to the MOSFET, and the electric current inputted to a drain terminal 10 is taken out of a source terminal 17 through the SIT structure; the drain 23, the channel region 24 and the source region 30 of the MOSFET structure; and a source electrode 20. The basic portion that maintains a high blocking voltage is similar to that in the SIT, and the SIT is turned off through a pinch-off region 31.

Figure 10:
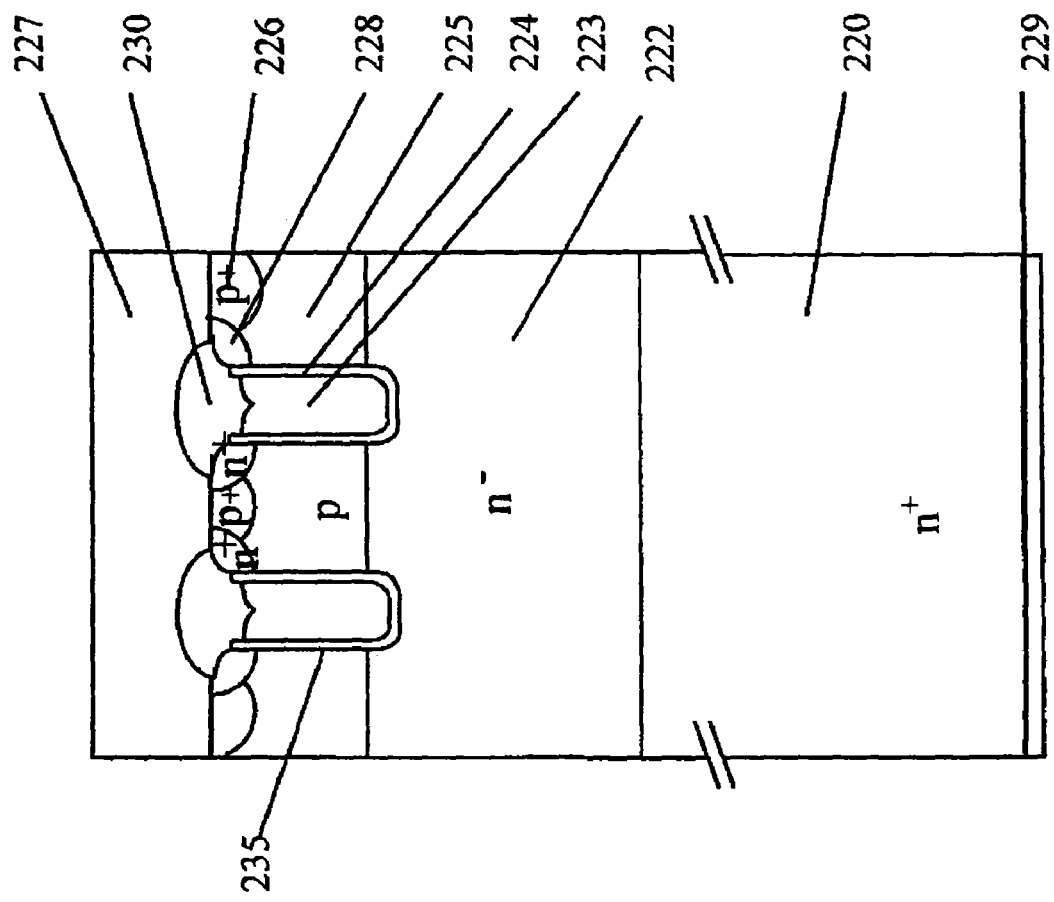
FIG. 10 is a cross-sectional view showing the structure of a conventional vertical trench gate MOSFET.
Figure 11:
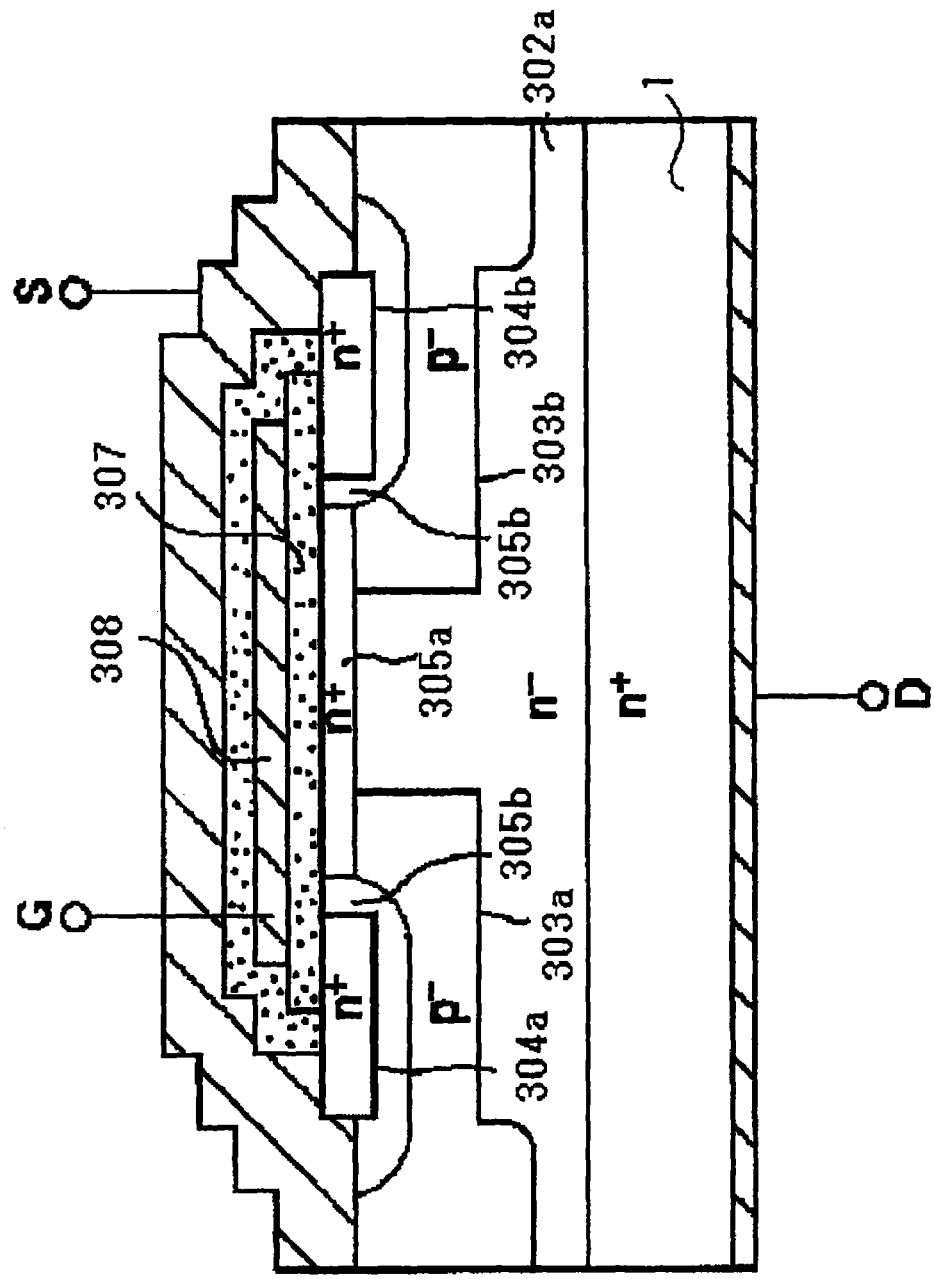
FIG. 11 is a cross-sectional view of a conventional insulated gate silicon carbide semiconductor device.

The semiconductor device according to the invention can be turned on and off by applying a voltage to the gate terminal 18 of the MOSFET, as shown in the equivalent circuit diagram of FIG. 2. This device can basically be a normally-off device by the fact that the MOSFET 15 is serially connected to the SIT 16. In the semiconductor device shown in FIG. 1, which has been described with reference to the first embodiment, no electric field is applied to the corner of the gate insulating film 25. Therefore, even when a sufficiently large voltage is applied between the source and the drain, the blocking voltage of the whole element will not be limited by the blocking voltage of the gate insulating film 224 (the gate insulating film 25 in FIG. 1) unlike the conventional trench gate MOSFET shown in FIG. 10. Furthermore, as in a SIT, since the high-concentration $n^+$ second source region 23 of the SIT is present in the surface, size reduction of the pinch-off region 31 will not result in high resistance. The resistance of the whole element can thus be suppressed to a small value even when the MOSFET is serially added to the SIT. In the p-base region 26 and the $p^+$ gate region 27, which affect the size reduction, the characteristics thereof are not sensitive to the size reduction, so that these regions can be minimized according to advances of the microprocessing technology. The size reduction and low resistance will therefore be achieved at the same time. The disadvantages of the SIT and the MOSFET can thus be solved in a complementary manner, allowing a device using excellent characteristics of the SIT and the MOSFET to be provided.

Figure 3A:
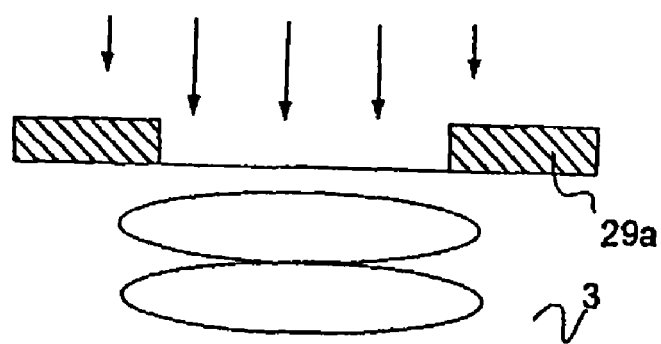
FIGS. 3A to 3G are cross-sectional views showing the method for manufacturing the insulated gate silicon carbide semiconductor device of the invention.

FIGS. 3A to 3G are cross-sectional views of the main portion of the semiconductor substrate showing an example of the method for manufacturing the insulated gate silicon carbide semiconductor device according to the first embodiment of the invention. The wafer used in this method has the n-type high-resistance (low-concentration) drift layer 3 formed through epitaxial growth with the thickness and impurity concentration controlled on a high-concentration $n^+$ SiC single crystal substrate (not shown). In FIG. 3A, a photomask is used to form an opening in an ion implantation mask 29a in the region where the $p^+$ gate region is formed, and p-type impurity ions are implanted as indicated by the arrows. In an SiC semiconductor substrate, aluminum (Al) is typically used as the p-type impurity. In this method, Al ions are implanted into the regions 26 and 27 to two different depths and different concentrations. The higher-concentration (approximately $1 \times 10^{18}$ cm$^{-3}$ to $1 \times 10^{20}$ cm$^{-3}$) region is formed in the deeper $p^+$ gate region 27 to operate it primarily as the gate of the SIT, while a region having a concentration of approximately $1 \times 10^{17}$ cm$^{-3}$ to $1 \times 10^{18}$ cm$^{-3}$ is formed in the shallower p-base region 26.

Figure 3B:
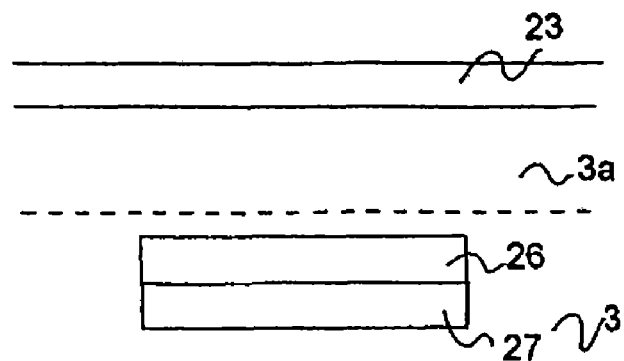

In FIG. 3B, the $p^+$ gate region 27 and the p-base region 26 that have undergone the ion implantation processes are activated through heat treatment at a high temperature of 1500 to 1800° C., and the n-type high-resistance (low-concentration) drift layer 3a is formed above these regions through n-type SiC epitaxial growth. To form the source region of the SIT on the entire surface, the high-concentration $n^+$ second source region 23 is then formed through ion implantation or epitaxial growth. In an SiC semiconductor, nitrogen or phosphorus is typically used as the n-type impurity.

Figure 3C:
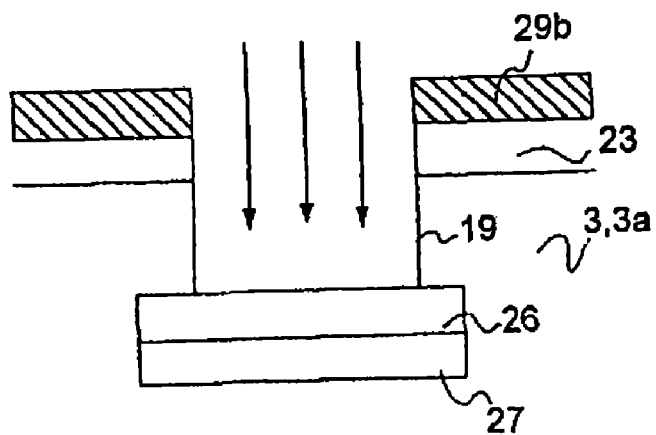
Figure 3D:
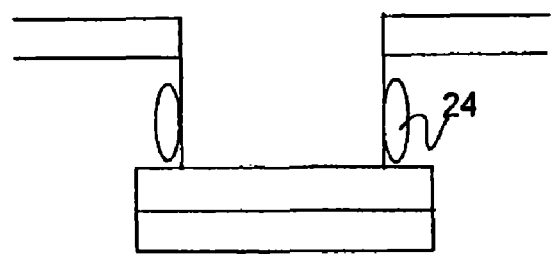
Figure 3E:
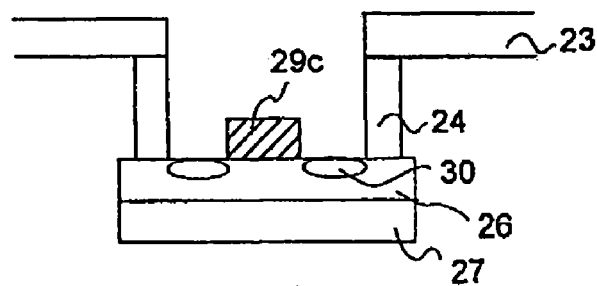

In FIG. 3C, an etching mask 29b formed of an insulating film or the like is used to form the trench 19 in such a way that it extends from the surface of the wafer in the direction perpendicular thereto and reaches the $p^+$ base region 26. In FIG. 3D, oblique ion implantation with respect to the wafer surface is carried out to create the p-channel regions 24 for forming the MOS structure on the sidewall of the trench. In FIG. 3E, a mask 29c is provided in a predetermined portion at the bottom of the trench 19 and high-concentration n-type ions are implanted for the source of the MOSFET. The implanted portions similarly undergo a high-temperature heat treatment at 1500 to 1800° C. as described above to form the $n^+$ first source regions 30.

Figure 3F:
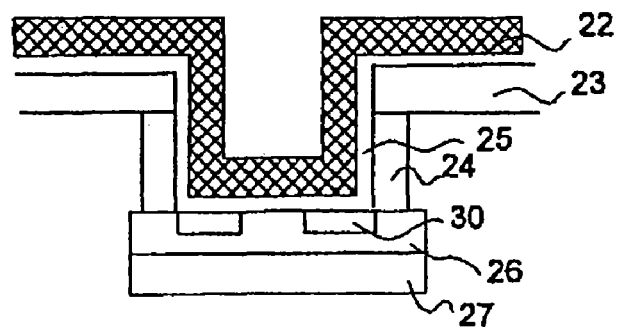
Figure 3G:
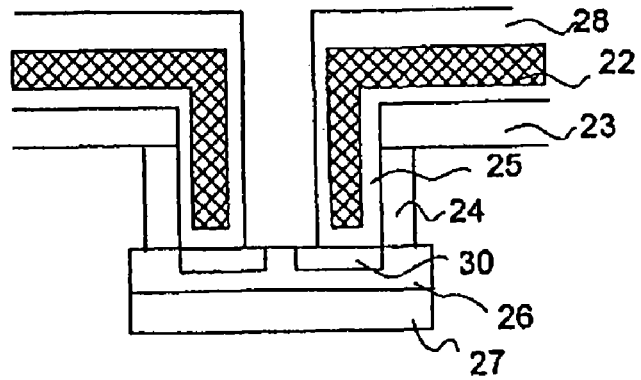
Figure 4A:
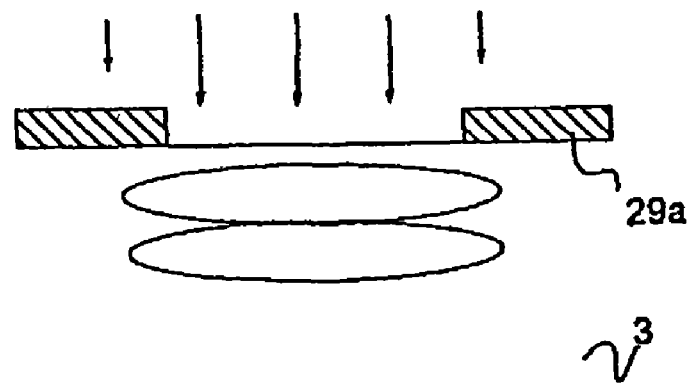
FIGS. 4A to 4G are cross-sectional views showing the method for manufacturing the insulated gate silicon carbide semiconductor device according to a second embodiment of the invention.
Figure 4B:
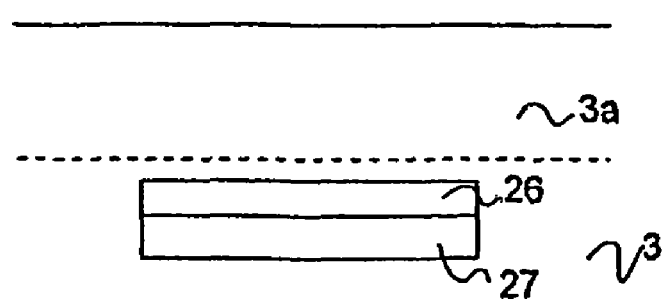
Figure 4C:
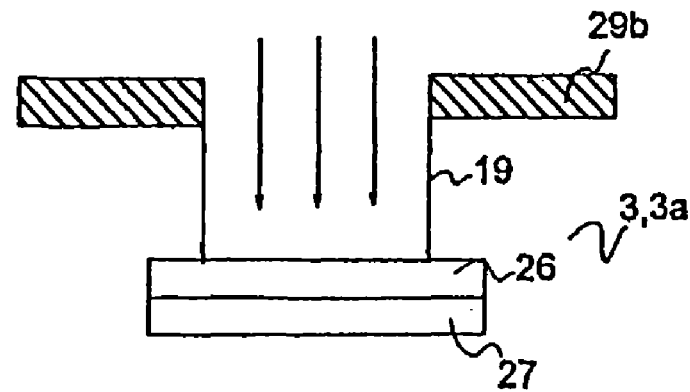
Figure 4D:
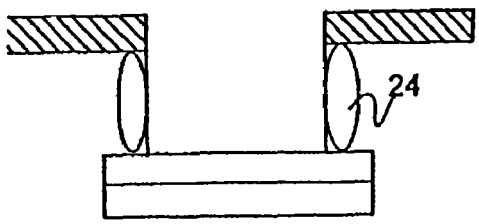
Figure 4E:
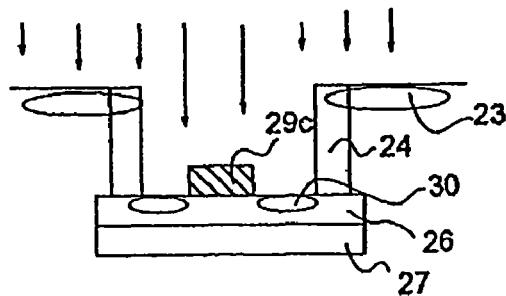
Figure 4F:
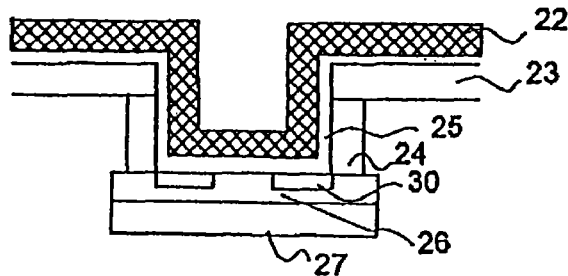
Figure 4G:
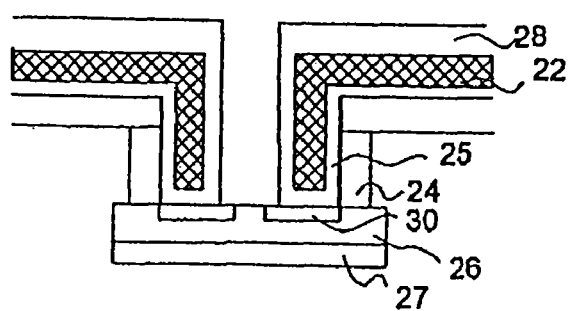

In FIG. 3F, the gate insulating film 25 is formed on the substrate surface through thermal oxidation or CVD. A gate material, such as polysilicon, is deposited on the gate insulating film 25 to form the gate electrode 22. In FIG. 3G, the gate electrode 22 is patterned and the interlayer insulating film 28 is formed on the gate electrodes 22. A contact hole is then created. Although not illustrated in FIG. 3G, the source electrode 20 and the drain electrode 21 shown in FIG. 1 are formed on the front side and the backside, respectively. The insulated gate silicon carbide semiconductor device having the structure in FIG. 1 is thus obtained. As an ohmic electrode film to achieve good conductive contact of the drain electrode 21 and the source electrode 20 with the surface of the SiC semiconductor substrate, a film made of metal, such as Ni and Ti, is typically used. Furthermore, to achieve good wire bonding connection, Al is formed on the outermost surface of the electrode film to a thickness of a few micrometers. To prevent oxidation and enhance the solder bondability, the outermost surface of the electrode film is preferably finished by coating Au.

Second Embodiment

FIGS. 4A to 4G are cross-sectional views of the main portion of the semiconductor substrate showing, as a second embodiment, another method for manufacturing the insulated gate silicon carbide semiconductor device according to the invention. The manufacturing method shown in FIGS. 4A to 4G differs from the manufacturing method shown in FIGS. 3A to 3G in that the $n^+$ second source region 23, which becomes the source of the SIT structure including the drain electrode 21, the $n^+$ semiconductor substrate 1, the n-type high-resistance (low-concentration) drift layer 3, and the $n^+$ second source region 23 shown in FIG. 1, is not formed in the stage shown in FIG. 4B unlike in FIG. 3B, but formed in the later step shown in FIG. 4E simultaneously with the $n^+$ first source regions 30 of the MOSFET. Such a manufacturing method allows the steps to be carried out with a slightly greater efficiency than in the manufacturing method shown in FIGS. 3A to 3G.

Third Embodiment

FIG. 5 is a cross-sectional view of the insulated gate silicon carbide semiconductor device showing a third embodiment according to the invention. Although the basic configuration of this embodiment is similar to that shown in FIG. 1, FIG. 5 differs from FIG. 1 showing the first embodiment in that the gate electrode 22 formed via the gate insulating film 25 in FIG. 1 is not formed immediately above the source region (n+ second source region) 23 of the SIT structure or the surface of the semiconductor substrate. One reason of this is to lower the capacitance between the gate and the source, and another reason is to reduce the total area of the gate insulating film 25. The former is suitable for high-speed switching, and the latter is effective to improve the yield of the gate insulating film 25.

Fourth Embodiment

FIG. 6 is a cross-sectional view of the insulated gate silicon carbide semiconductor device showing a fourth embodiment according to the invention. In the fourth embodiment, the high-concentration region corresponding to the source region of the SIT structure, that is, the n+ second source region 23 in FIGS. 1 and 5 is omitted. The blocking voltage-oriented design is therefore easily carried out although the on-resistance increases. That is, it is necessary to set the width of the pinch-off region 31 and the depth of the trench 19 in the SIT in such a way that a designed blocking voltage is obtained by such dimensions. If the dimensions shift from their optimum values, there is a risk of reduction in blocking voltage, but no high-concentration region (n+ second source region 23) is required as shown in FIG. 6, resulting in a structure similar to a typical vertical MOSFET. Therefore, there is no need to control the depth of the high-concentration region, which means that there is very little risk of reduction in blocking voltage due to design reasons.

Fifth Embodiment

FIG. 7 is a cross-sectional view of the insulated gate silicon carbide semiconductor device showing a fifth embodiment according to the invention. Although the basic configuration of this embodiment is similar to that shown in FIG. 1, in the portion where the source electrode 20 is in ohmic contact with the n+ first source region 30 and the p-base region 26, the contact between the source electrode 20 and the p+ gate region 27 is achieved by forming a trench 40. This approach aims to obtain low ohmic resistance by thus locally digging deep into the high-concentration p+ gate region 27 to form the contact trench 40 and expose the high-concentration p+ gate region 27 at the bottom, in consideration of the fact that it is difficult to expose the high-concentration p+ gate region 27 in the portion where the source electrode 20 forms ohmic contact at the bottom of the trench 19 in the manufacturing methods shown in FIGS. 3A to 3G and 4A to 4G.

The insulated gate silicon carbide semiconductor device according to the invention is suitably used in inverters and power conversion devices. In coming years, applications to driving a motor installed in a motor vehicle are particularly expected.

The invention has been described with respect to certain preferred embodiments thereof. It will be understood that modifications and variations are possible within the scope of the appended claims.

This application claims priority from Japanese Patent Application 2007-017945 filed on Jan. 29, 2007, the content of which is incorporated herein by reference.

What is claimed is:

1. A method for manufacturing an insulated gate silicon carbide semiconductor device, the method comprising:
    forming a first conduction-type low-concentration deposition semiconductor layer deposited on a first conduction-type high-concentration semiconductor substrate;
    forming a second conduction-type base region in the low concentration layer of the first conduction-type substrate via ion implantation;
    forming a trench in the substrate that extends from the surface of the substrate to the gate region;
    performing oblique ion implantation with respect to the substrate surface to form second conduction-type channel regions of low concentration in the sidewalls of the trench;
    forming first conduction-type first source regions of high concentration at the bottom of the trench, wherein the first source region is formed within the base region;
    forming a first conduction-type second source region of high concentration in a surface layer of the substrate, wherein the second source region is formed on the channel region;
    depositing a gate insulating film over the sidewalls of the trench and forming a gate electrode on the gate insulating film;
    forming an interlayer insulating file over the gate electrodes; and
    forming a source electrode in the trench and a drain electrode on a bottom surface of the substrate.

2. A method for manufacturing an insulated gate silicon carbide semiconductor device as claimed in claim 1, wherein the first conduction-type first source region and a first conduction-type second source region are formed simultaneously.

3. A method for manufacturing an insulated gate silicon carbide semiconductor device as claimed in claim 1, wherein the gate insulating film and the gate electrode extend over the second source region.

4. A method for manufacturing an insulated gate silicon carbide semiconductor device as claimed in claim 1, wherein the base region is formed of second conduction-type high concentration layer and a second conduction-type low concentration layer.

5. A method for manufacturing an insulated gate silicon carbide semiconductor device, the method comprising:
    forming a second conductivity type base region in a low concentration layer of a first conductivity type substrate via ion implantation, the second conduction-type base region having a two-layer configuration including a deep high-concentration first base region and a shallow low-concentration second base region;
    forming a first conductivity type second source region of high concentration in a surface layer of the substrate;
    forming a trench in the substrate that extends from the surface of the substrate to the gate region;
    performing oblique ion implantation with respect to the substrate surface to form second conductivity-type channel regions of low concentration in the sidewalls of the trench;
    forming first conductivity-type first source regions of high concentration at the bottom of the trench;

depositing a gate insulating film over the sidewalls of the trench and forming a gate electrode on the gate insulating film;

forming an interlayer insulating file over the gate electrodes; and forming a source electrode in the trench.

6. A method for manufacturing an insulated gate silicon carbide semiconductor device, the method comprising:

forming a first conduction-type low-concentration deposition semiconductor layer deposited on a first conduction-type high-concentration semiconductor substrate;

forming a second conduction-type base region in the low concentration layer of the first conduction-type substrate via ion implantation, the base region being formed of a second conduction-type high concentration layer and a second conduction-type low concentration layer;

forming a trench in the substrate that extends from the surface of the substrate to the gate region;

performing oblique ion implantation with respect to the substrate surface to form second conduction-type channel regions of low concentration in the sidewalls of the trench;

forming first conduction-type first source regions of high concentration at the bottom of the trench;

depositing a gate insulating film over the sidewalls of the trench and forming a gate electrode on the gate insulating film;

forming an interlayer insulating file over the gate electrodes; and forming a source electrode in the trench and a drain electrode on a bottom surface of the substrate.

\* \* \* \* \*